(12) United States Patent  (10) Patent No.: US 7,470,951 B2
Mathew et al.  (45) Date of Patent: Dec. 30, 2008

(54) HYBRID-FET AND ITS APPLICATION AS SRAM

(75) Inventors: Leo Mathew, Austin, TX (US); Jerry G. Fossum, Gainesville, FL (US)

(73) Assignee: Freescale Semiconductor, Inc., Austin, TX (US)

( * ) Notice: Subject to any disclaimer, the term of this patent is extended or adjusted under 35 U.S.C. 154(b) by 55 days.

(21) Appl. No.: 11/047,543

(22) Filed: Jan. 31, 2005

(65) Prior Publication Data

US 2006/0170066 A1  Aug. 3, 2006

(51) Int. Cl.
*H01L 29/94* (2006.01)

(52) U.S. Cl. .............. 257/327; 257/328; 257/329; 257/350; 257/347; 257/348; 257/349; 257/E51.005

(58) Field of Classification Search .......... 257/327, 257/328, 329, 350, 347, 348, 349, E51.005
See application file for complete search history.

(56) References Cited

U.S. PATENT DOCUMENTS

| | | | |
|---|---|---|---|
| 6,177,706 B1 | 1/2001 | Shindo et al. | |
| 6,252,284 B1 | 6/2001 | Muller et al. | |
| 6,373,123 B1 * | 4/2002 | Clampitt | 257/623 |
| 6,413,802 B1 | 7/2002 | Hu et al. | |
| 6,630,712 B2 | 10/2003 | Yu | |
| 6,864,519 B2 | 3/2005 | Yeo et al. | |
| 7,098,477 B2 * | 8/2006 | Zhu et al. | 257/66 |
| 7,193,279 B2 * | 3/2007 | Doyle et al. | 257/401 |
| 2004/0150071 A1 * | 8/2004 | Kondo et al. | 257/623 |
| 2004/0222477 A1 | 11/2004 | Aller et al. | |
| 2004/0235300 A1 | 11/2004 | Mathew et al. | |
| 2007/0085134 A1 * | 4/2007 | Anderson et al. | 257/326 |

* cited by examiner

*Primary Examiner*—Evan Pert
*Assistant Examiner*—Tan N Tran
(74) *Attorney, Agent, or Firm*—John A. Fortkort; Fortkort & Houston P.C.

(57) ABSTRACT

A semiconductor device (51) is provided herein. The semiconductor device comprises (a) a substrate (57), a semiconductor layer (53) disposed on said substrate and comprising a horizontal region (54) and a fin which extends above, and is disposed adjacent to, said horizontal region, and (c) at least one channel region (63) defined in said fin and in said horizontal region.

20 Claims, 6 Drawing Sheets

HYBRID-FET AND ITS APPLICATION AS SRAM

FIELD OF THE INVENTION

The present disclosure relates generally to field effect transistors (FETs), and more particularly, to hybrid FINFET devices and to methods for making the same.

BACKGROUND OF THE INVENTION

The well known and ongoing movement in the semiconductor industry toward further miniaturization of semiconductor devices has required regular increases in the density of devices placed on IC substrates. This, in turn, has necessitated reductions in the dimensions of the devices themselves and of their components. For example, the dimensions of gates, and the channel separation of source and drain elements, have become progressively smaller.

The aforementioned trend presents issues for the performance characteristics, reliability, and durability of semiconductor devices. In particular, as semiconductor devices continue to shrink in size, problems with short channel effects, punch-through, and current leakage become more pronounced. These problems have significant adverse impacts on the performance of semiconductor devices, and greatly complicate the manufacturing processes used to fabricate these devices.

In particular, as channel lengths are reduced, the source and drain depletion regions are disposed in closer proximity to each other. In such short channel devices, the drain begins to influence the channel and reduces the influence of the gate. This phenomenon is known as the short channel effect. The impact of the short channel effect on device performance is often manifested as a reduction in the device threshold voltage or as an increase in the sub-threshold current.

One method for reducing or eliminating short channel effects is to reduce the thickness of the channel region between the source and drain. This may be accomplished, for example, through the use of FDSOI devices or Ultra-thin body devices. Even better short channel control is possible by providing gates on either side of this thin channel region, since two gates control the thin silicon channel region much more effectively and reduce the influence of the drain on the channel.

One of the outcomes of the continuing efforts to resolve the short channel effect and the other problems as noted above has been the development of FINFETs. FINFETs are field effect transistors (FETs) that are equipped with a gate electrode controlling a thin vertical fin-shaped channel region. One example of such a device is depicted in FIG. 1. The device depicted therein is fabricated on a dielectric layer 2 and includes a silicon drain island 4 and a source island 6 that are connected by a silicon fin or channel 8. The source, drain, and channel are covered by a dielectric layer or hard mask 9 during a stage of the process, and a gate 11 extends across both sides of the channel fin 8 and is isolated from the channel by a gate oxide (not shown). Thus, inversion layers are formed on both sides of the channel. Such a structure has the advantage of providing double gates to effectively suppress the short channel effect and to enhance drive current. Also, since the channels are parallel planes, parasitic corner effects are overcome. Moreover, since the fin is very thin, doping of the fin is not required in order to suppress the short channel effect.

While FinFET devices such as that depicted in FIG. 1 have many advantages, there is still a need in the art for further improvements in these devices. For example, in conventional FinFET designs, when more current is needed from a FinFET, fins are added in parallel with the gate extending over each of the fins. Hence, in order to get increased current for a given area, the pitch between the fins has to be minimized. Unfortunately, it has proven difficult to achieve further reductions in pitch in FINFET devices beyond the values already achieved, due to fundamental limitations in existing lithography techniques.

There is thus a need in the art for devices and methodologies which overcome this problem. In particular, there is a-need in the art for FinFET devices with increased active area, and for methods of making the same. These and other needs are met by the FET devices and methodologies described herein.

SUMMARY OF THE INVENTION

In one aspect, a semiconductor device is provided which comprises (a) a substrate having a semiconductor layer disposed thereon and having a first dielectric layer disposed between the substrate and the semiconductor layer; (b) at least one vertical fin defined in the semiconductor layer, said vertical fin being separated from other vertical fins by a depression that does not extend through the semiconductor layer; (c) a horizontal region in the said depressions comprising a semiconductor material, (d) a gate extending across said vertical fins and horizontal ridges and (d) doped regions defined in said vertical fins and in said horizontal region that forms source and drain of a transistor.

In another aspect, a method of making a semiconductor device is provided herein. In accordance with the method, a substrate having a semiconductor layer disposed thereon and having a first dielectric layer disposed between the substrate and the semiconductor layer is provided, at least one vertical fin is formed in the semiconductor layer, said vertical fins being separated from each other by a depression that does not extend through the semiconductor layer; a horizontal region in the said depressions comprising a semiconductor material, a gate extending across said vertical fins and horizontal ridges and (d) doped regions defined in said vertical fins and in said horizontal region that forms source and drain of a transistor.

These and other aspects of the present disclosure are described in greater detail below.

DETAILED DESCRIPTION

It has now been found that the aforementioned needs for improving the active area of FINFET devices may be met by providing additional components, such as semiconductor materials and/or source/drain and channel regions, in the regions between the fins in these devices. The resulting hybrid devices have greater active area than existing FinFET devices, because they make full use of essentially the entire active surface area of the device. By contrast, in conventional FinFET devices such as that depicted in FIG. 1, the regions between the fins have no electrical channel. Moreover, the present approach achieves this increase in density without requiring further reductions in the pitch of the FINFET device which, as previously noted, presents significant challenges for existing lithography techniques.

Figure 2:
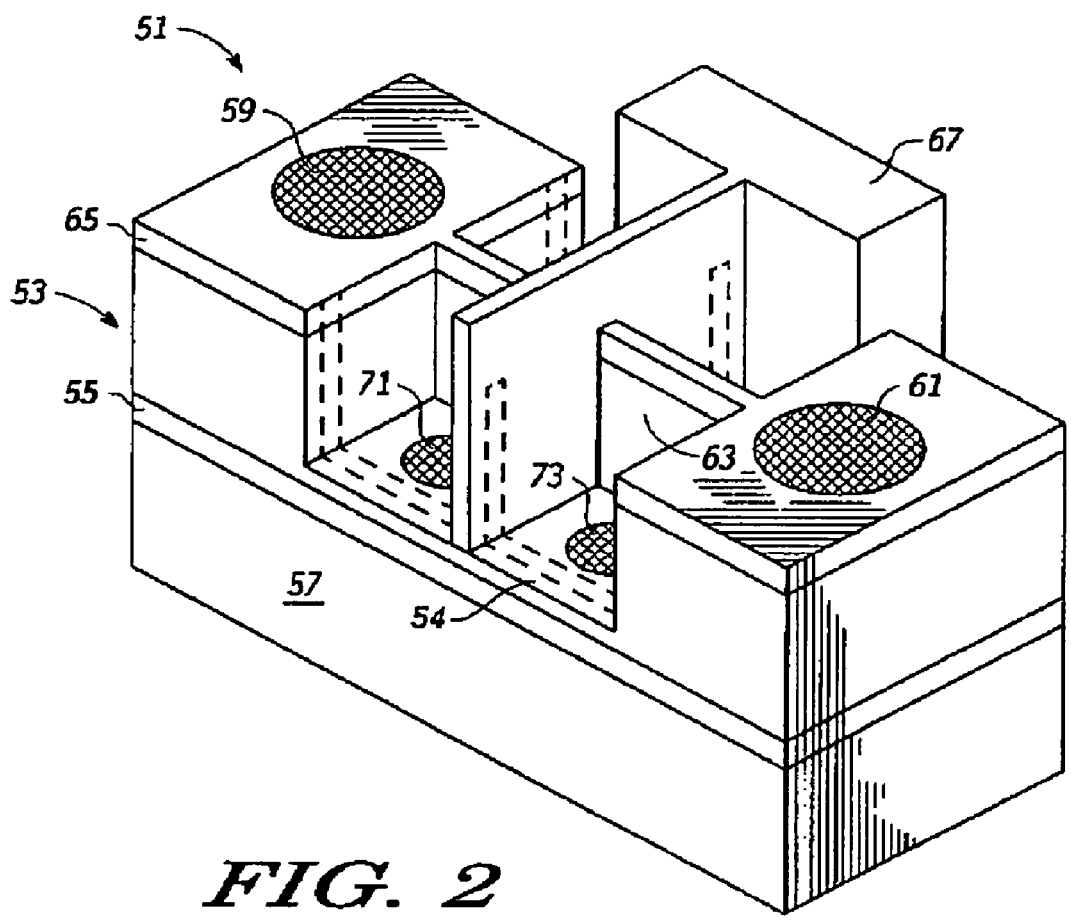
FIG. 2 is a perspective view of a Hybrid-FET device made in accordance with the teachings herein.

One non-limiting example of a hybrid FET structure that may be made in accordance with the teachings herein is depicted in FIG. 2. The device 51 depicted therein includes a semiconductor layer 53, a dielectric layer 55 (such as a buried oxide layer), and a substrate 57.

Referring again to FIG. 2, the device 51 includes a source region 59 and a drain region 61 that are connected by one or more semiconductor fins 63 which serve as a channel region. When the device comprises a plurality of such fins, these fins are arranged in parallel. For clarity of illustration, the fins on either side of fin 63 have been removed (the footprints of the removed fins are indicated by dashed lines). The source region 59, drain region 61 and fins 63 are capped with a nitride layer 65 or other dielectric layer.

Figure 1:
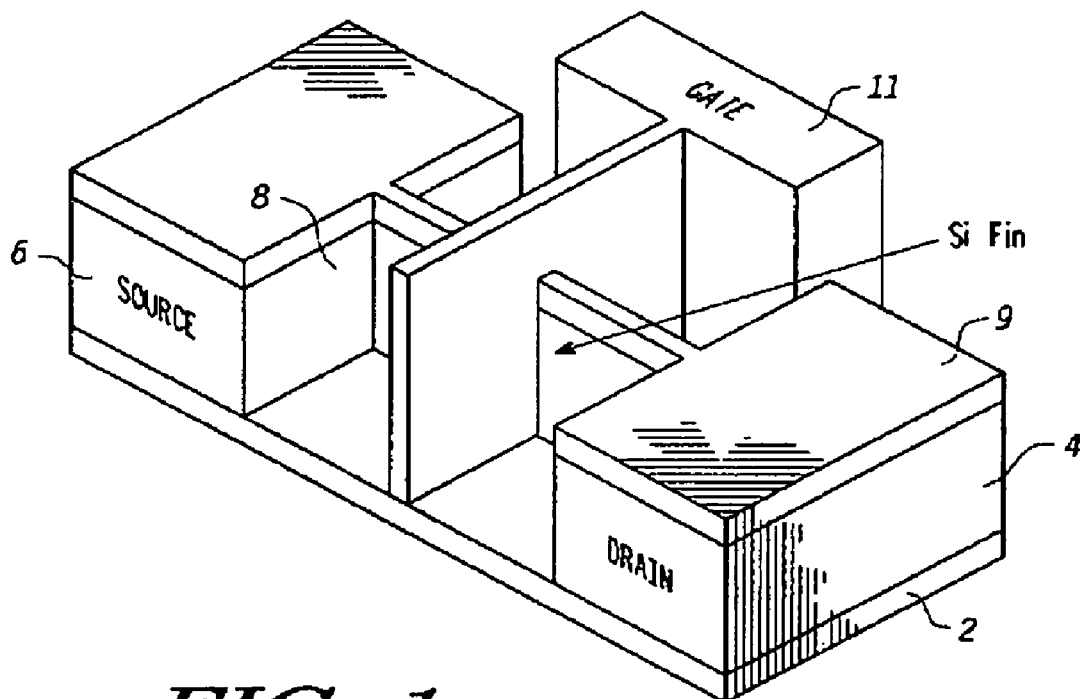
FIG. 1 is a perspective view of a prior art FINFET device.

Upon comparison of the devices depicted in FIGS. 1 and 2, it will be appreciated that, unlike the device of FIG. 1, in the device of FIG. 2, the semiconductor layer 53 extends across the horizontal region 54 disposed between the source 59 and drain 61 regions and spanned by the fins. Consequently, through suitable extension of the implant regions, the source 59 and drain 61 regions can be extended into this horizontal region 54, thereby replacing any dead space in the device with active areas. Source and drain regions. and associated channel regions, may also be defined in the horizontal region 54 through the provision of implant regions 71 and 73.

The gate 67 extends across the fin 63 and over the horizontal region 54 and is isolated from the fins by a gate oxide layer (not shown). The channels defined by the fins are on the sidewalls of the fin 63, and the channels defined by the horizontal region 54 are on the surface thereof. Thus, inversion layers are formed on both sides of the vertical fin 63 and the surfaces of the horizontal region 54. Consequently, the device of FIG. 2 has the advantage of providing double gates to effectively suppress the short channel effect and to enhance drive current. Since the fin 63 is very thin and the semiconductor layer 53 in the horizontal region 54 can also be very thin, the short channel control of these devices is substantially better than bulk semiconductor devices.

Methodologies are disclosed herein for making devices such as the hybrid FinFET device depicted in FIG. 2. These methodologies can be appreciated with respect to the non-limiting embodiment of the process depicted in FIGS. 3-8 for the manufacture of a hybrid-FET in accordance with the teachings herein, it being understood that this methodology is applicable to other types of semiconductor devices as well.

Figure 3:
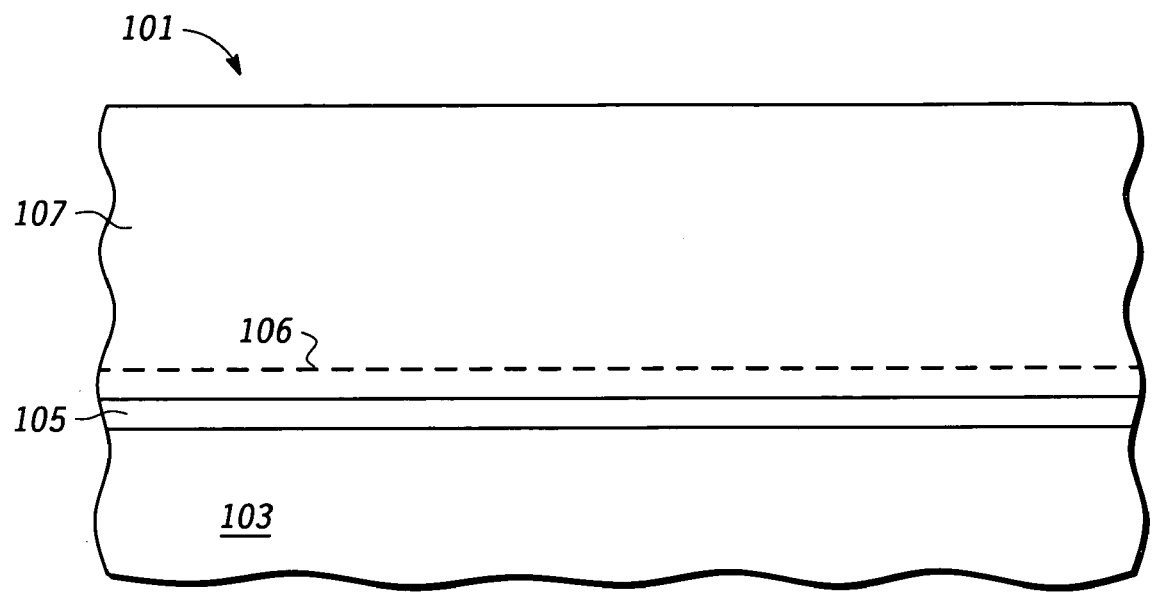
FIG. 3 is a partial side cross sectional view of one embodiment of a semiconductor wafer during a stage in the manufacture of a transistor according to the present disclosure.

As seen in FIG. 3, the process commences with a wafer 101 comprising a substrate 103 having a buried oxide layer 105 disposed thereon, and having a semiconductor layer 107 disposed over the buried oxide layer 105. In the particular embodiment depicted, the wafer 101 has a layer of SiGe or Ge implanted or epitaxially grown therein which serves as an endpoint detection layer for etching. The wafer may be an SOI wafer, and may have layers in addition to those shown. However, such additional layers have been omitted for ease of illustration.

Figure 4:
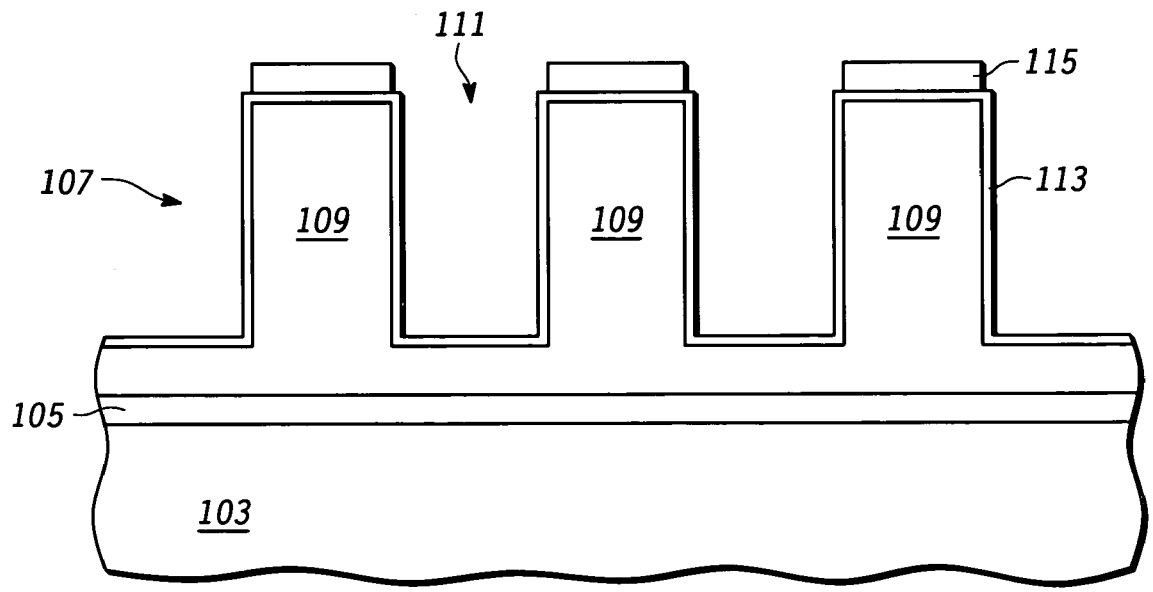
FIG. 4 is a partial side cross sectional view of one embodiment of a semiconductor wafer during a stage in the manufacture of a transistor according to the present disclosure.

As seen in FIG. 4, a dielectric layer 115 is disposed over 107, and the semiconductor layer 107 is subsequently etched using conventional masking and etching techniques or other photolithographic techniques to define a series of fins 109 or ridges in the semiconductor layer 107. The end point detection layer 106 (see FIG. 3) may be used as a reference in controlling the extent of the etching. Alternatively, the etching may be timed to produce fins of a predetermined height (or, put another way, to achieve trenches 111 between the fins that are of a predetermined depth). A dielectric layer 113 (comprising a material such as silicon dioxide) is then formed over semiconductor layer 107

In some embodiments, semiconductor layer 107 is made of epitaxial silicon bonded to insulating layer 105. In other embodiments, semiconductor layer 107 may be made of polysilicon or other semiconductor materials. Dielectric layer 113 may also be made of other dielectric materials, including silicon nitride, high-K dielectrics, or combinations thereof.

Several variations are possible in the process steps previously described. The dielectric 115 may be a combination of dielectrics such as silicon dioxide or silicon oxynitride or combinations thereof. The dielectric may be completely removed from the fins and the gate dielectric 113 may be formed on all sides of the vertical fins 109 and on horizontal regions 54. In one embodiment, region 109 is formed without the use of dielectric materials by directly pattering the region 107.

Figure 5:
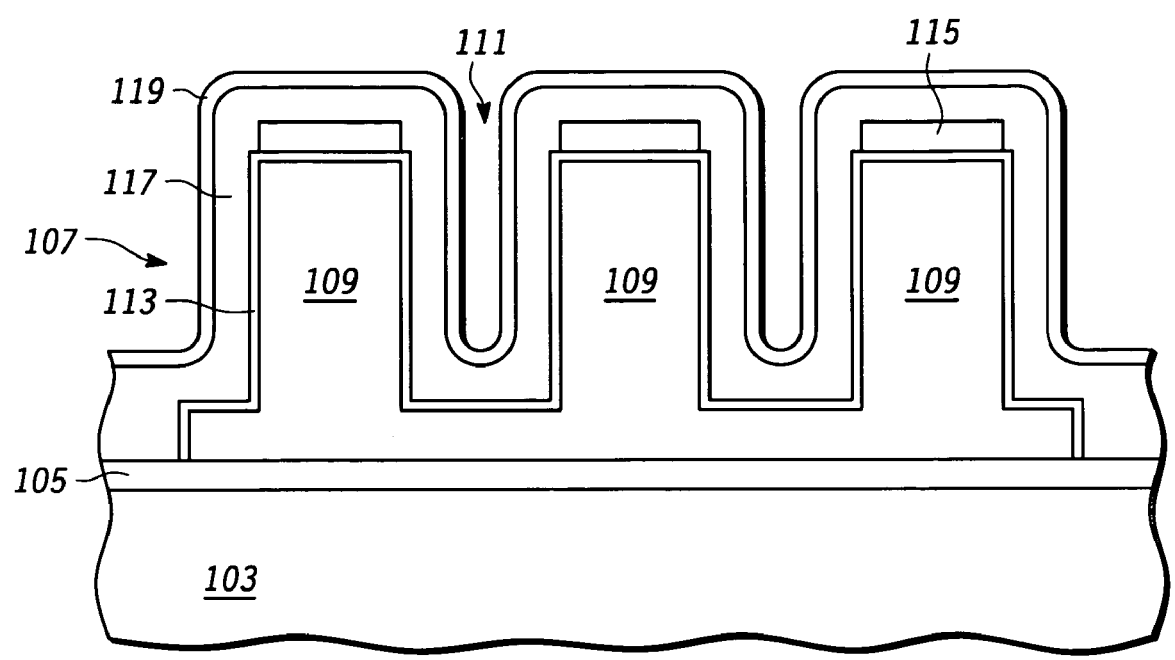
FIG. 5 is a partial side cross sectional view of one embodiment of a semiconductor wafer during another stage in the manufacture of a transistor according to the present disclosure.

Referring now to FIG. 5, after the vertical fins 109 and horizontal regions 54 are defined, subsequent masking and etching is performed to singulate hybrid transistors from each other by etching away portions of the horizontal region 54. A layer of gate dielectric 113 is formed on the structure, after which a conformal layer of gate electrode 117 is deposited over the structure. Suitable masking techniques may be utilized to confine the deposition to the desired area. The dimensions and shape of the gate electrode layer 117 may be controlled through suitable masking and etching. Preferably, the gate electrode layer 117 comprises polysilicon. However, it will be appreciated that gate electrode layer 117 may also comprise other gate materials, including, but not limited to, tungsten, titanium, titanium nitride, tantalum silicon nitride, silicides such as cobalt or nickel silicides, germanium, silicon germanium, other metals, or various combinations or sub-combinations of the foregoing.

Figure 6:
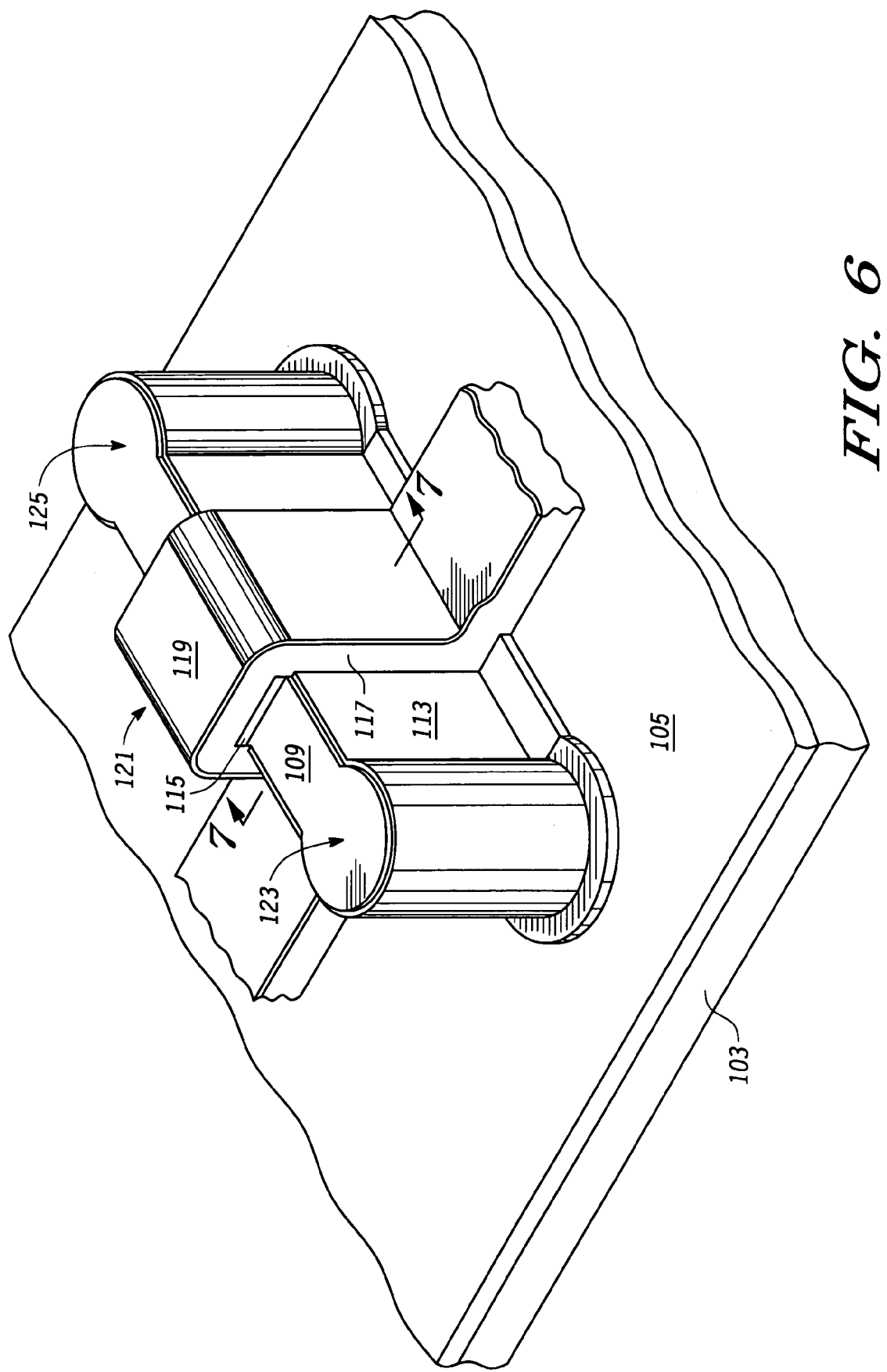
FIG. 6 is a partial isometric view of one embodiment of a semiconductor wafer during another stage in the manufacture of a transistor according to the present disclosure.

FIG. 6 is a partial isometric view of the foregoing structure after layers 117 and 119 have been patterned to form gate structure 121. Hybrid-FET or multiple hybrid-FET devices, with the gate structure 121 overlapping them, may also be formed as explained in reference to FIG. 2. In some embodiments, layers 117 and 119 are patterned by the utilization of conventional photolithographic techniques. During the patterning, the portion of nitride layer 119 disposed over fin 109 (but not located under gate structure 121) is removed. In other embodiments, this portion of nitride layer 115 may be removed at a later stage during manufacture.

The structure depicted in FIG. 6 includes current terminal regions 123 and 125 which are located at each end of fin 105. In one embodiment where the resultant transistor structure is a field effect transistor (FET), regions 123 and 125 serve as the source and drain regions, respectively. Regions 123 and 125 may be doped at this time by ion implantation, plasma doping, or through other suitable means. All or a portion of the regions of semiconductor material disposed between the fins 109 may likewise be doped. This is followed by typical processing such as formation of spacers and metalizing the source/drain and gate regions for subsequent contacts and interconnection.

Figure 7:
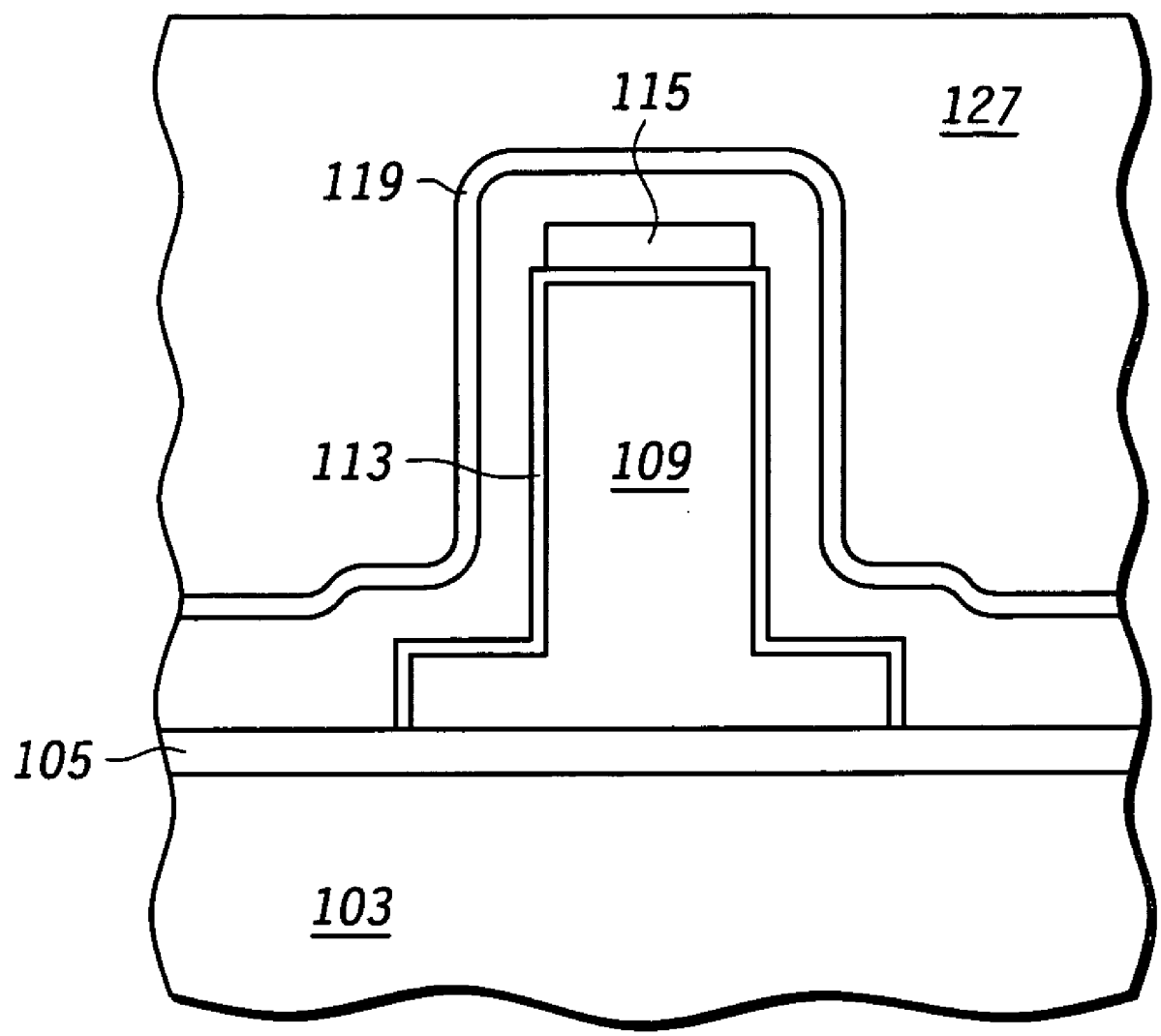
FIG. 7 is a partial side cross sectional view of one embodiment of a semiconductor wafer during another stage in the manufacture of a transistor according to the present disclosure.

FIG. 7. is a cross-section of the hybrid-FET of FIG. 6 taken along LINE 7-7. The horizontal regions 54 allow the active region or width of the transistor channel to be increased by changing the length of this region. By contrast, in conventional FinFET devices, the active area can only be increased incrementally through the incorporation of additional fins. In certain applications, as in SRAM memory cells, it is desirable to ratio the components used in the circuit. The Hybrid-FET devices disclosed herein can be integrated with conventional FinFET devices and, in such applications, the Hybrid-FET offers an effective way to ratio the various transistor components.

Figure 8:
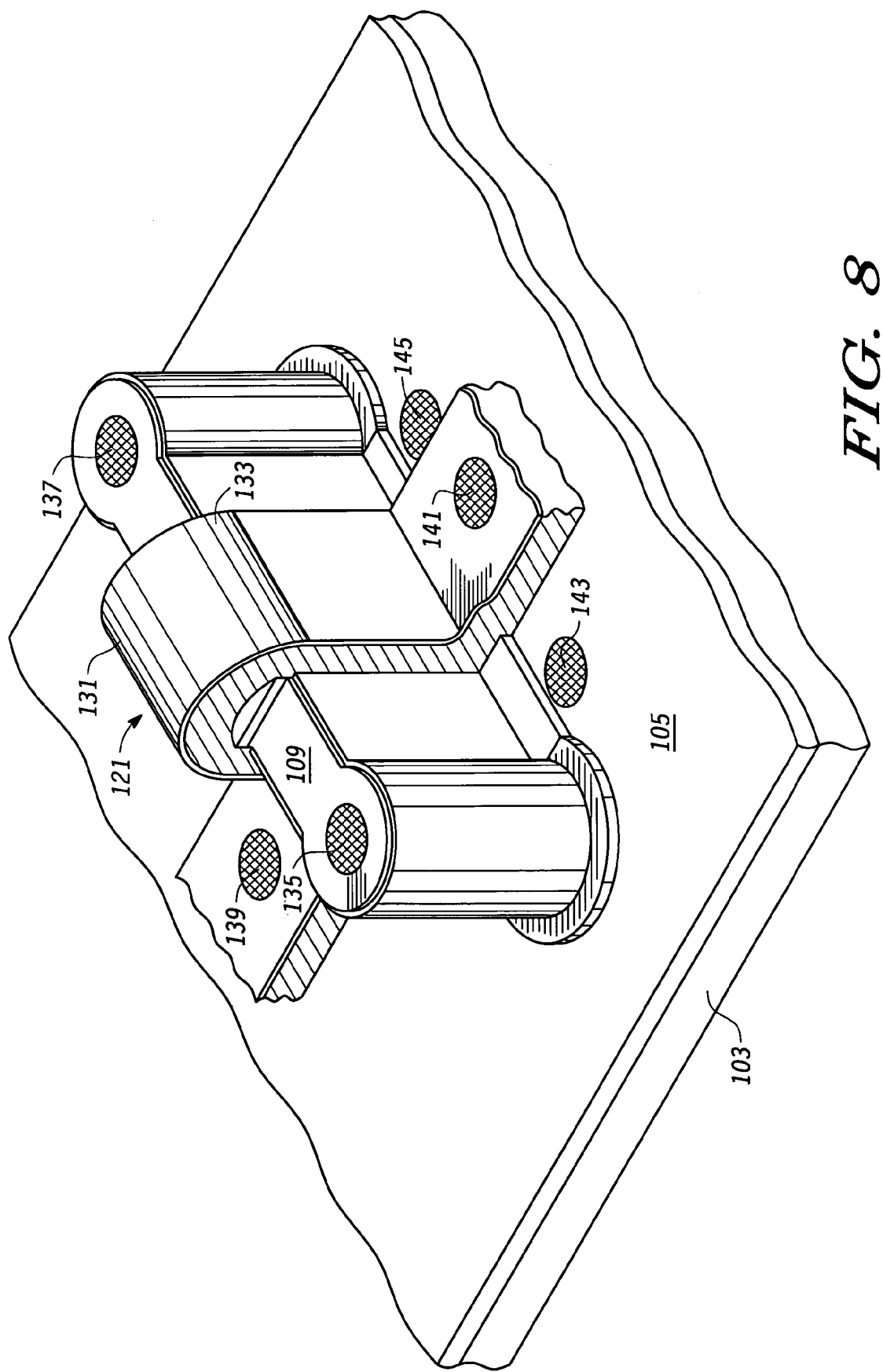
FIG. 8 is a partial isometric view of one embodiment of a semiconductor wafer during another stage in the manufacture of a transistor according to the present disclosure.

FIG. 8 illustrates a device made by the foregoing process after implantation. As seen therein, implantation processes have been used to define implant regions 135 and 137 in the vertical fins 109, and have been used to define implant regions 139 and 141 in the gate structure 121. In some embodiments, implant regions 143 and 145 may also be defined on the horizontal surfaces adjacent to the gate structure 121 as in FIG. 2, in which case the semiconductor layer used to define the gate structure will extend over that surface.

Hybrid-FET devices, and methods for making the same, have been provided herein. These hybrid devices offer improved active area, in comparison to conventional FINFET devices, through the provision of active area and additional components in the regions between the fins of the device. Moreover these devices can be effectively integrated with FinFET-like devices and can be used in combination with such devices to effectively ratio the width between the different devices. As a further advantage, the present approach does not require further reductions in the pitch of the device.

The above description of the present invention is illustrative, and is not intended to be limiting. It will thus be appreciated that various additions, substitutions and modifications may be made to the above described embodiments without departing from the scope of the present invention. Accordingly, the scope of the present invention should be construed in reference to the appended claims.

What is claimed is:

1. A semiconductor device, comprising:
a substrate;
a semiconductor layer disposed on said substrate and comprising an essentially planar region;
a fin, disposed on said planar region;
at least one channel region defined in said fin and in said planar region; and
a gate extending across said fin and said planar region;
wherein said fin comprises at least one source region disposed on a first side of said gate, and at least one drain region disposed on a second side of said gate, and wherein said at least one source region or said at least one drain region is a continuous region which extends over said fin and also extends over said planar region.

2. The semiconductor device of claim 1, wherein said at least one source region is a continuous region which extends over said fin and also extends over said planar region.

3. The semiconductor device of claim 1, wherein said at least one drain region is a continuous region which extends over said fin and also extends over said planar region.

4. The semiconductor device of claim 1, wherein said planar region comprises at least one source region disposed on a first side of said gate, and at least one drain region disposed on a second side of said gate.

5. The semiconductor device of claim 1, wherein a first end of said fin terminates in a first semiconductor wall, and wherein said at least one source region extends over said first wall.

6. The semiconductor device of claim 1, wherein said device is an SRAM cell.

7. The semiconductor device of claim 1, wherein said device is a FINFET.

8. The semiconductor device of claim 1, further comprising a dielectric layer, and wherein said dielectric layer is disposed between said substrate and said semiconductor layer.

9. The semiconductor device of claim 1, wherein said fin is in physical contact with said planar region.

10. The semiconductor device of claim 1, wherein said fin is essentially perpendicular to said planar region.

11. The semiconductor device of claim 1, wherein said fin is capped with a nitride layer.

12. The semiconductor device of claim 11, further comprising a dielectric layer disposed between said fin and said nitride layer.

13. The semiconductor device of claim 1, wherein said fin and said planar region form a unitary structure.

14. The semiconductor device of claim 1, wherein said substrate is a semiconductor substrate.

15. The semiconductor device of claim 1, wherein said substrate, said gate and said semiconductor layer comprise silicon.

16. The semiconductor device of claim 1, wherein said gate comprises a material selected from the group consisting of tungsten, titanium, titanium nitride, tantalum silicon nitride, cobalt silicide, nickel silicide, germanium, and silicon germanium.

17. The semiconductor device of claim 1, wherein said substrate has a layer of SiGe or Ge therein.

18. The semiconductor device of claim 1, wherein the width of said fin is greater than the height of said planar region.

19. The semiconductor device of claim 1, wherein the length of said gate is greater than the width of said fin, and wherein the thickness of said gate is greater than the height of the planar region.

20. The semiconductor device of claim 1, wherein the length of said gate is greater than the height of said planar region.

* * * * *